US008324881B2

(12) United States Patent
Trifonov et al.

(10) Patent No.: US 8,324,881 B2
(45) Date of Patent: Dec. 4, 2012

(54) BANDGAP REFERENCE CIRCUIT WITH SAMPLING AND AVERAGING CIRCUITRY

(75) Inventors: Dimitar T. Trifonov, Vail, AZ (US); Jerry L. Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 344 days.

(21) Appl. No.: 12/799,288

(22) Filed: Apr. 21, 2010

(65) Prior Publication Data
US 2011/0260708 A1 Oct. 27, 2011

(51) Int. Cl.
*G05F 3/30* (2006.01)
(52) U.S. Cl. .................. 323/314; 323/315; 327/539
(58) Field of Classification Search .......... 323/312–315; 327/539
See application file for complete search history.

(56) References Cited

U.S. PATENT DOCUMENTS

| | | | | |
|---|---|---|---|---|
| 4,570,114 A | * | 2/1986 | Heim | 323/313 |
| 5,352,972 A | * | 10/1994 | Pernici et al. | 323/313 |
| 5,867,012 A | * | 2/1999 | Tuthill | 323/313 |
| 6,052,020 A | | 4/2000 | Doyle | |
| 6,281,743 B1 | * | 8/2001 | Doyle | 327/539 |
| 6,323,801 B1 | * | 11/2001 | McCartney et al. | 341/172 |
| 7,009,373 B1 | * | 3/2006 | Garavan | 323/313 |
| 7,504,977 B2 | | 3/2009 | Doorenbos et al. | 341/143 |
| 7,511,648 B2 | | 3/2009 | Trifonov et al. | |
| 2009/0284242 A1 | * | 11/2009 | Motz | 323/313 |

FOREIGN PATENT DOCUMENTS
JP 2003338548 11/2003

OTHER PUBLICATIONS
PCT Search Report mailed Aug. 9, 2011.
* cited by examiner

*Primary Examiner* — Adolf Berhane
*Assistant Examiner* — Fred E Finch, III
(74) *Attorney, Agent, or Firm* — John J. Patti; Wade J. Brady, III; Frederick J. Telecky, Jr.

(57) ABSTRACT

A circuit for generating a band gap reference voltage ($V_{REF}$) includes circuitry ($I_3 \times 7$) for supplying a first current to a first conductor (NODE1) and a second current to a second conductor (NODE2). The first conductor is successively coupled to a plurality of diodes (Q0×16), respectively, in response to a digital signal (CTL-VBE) to cause the first current to successively flow into selected diodes. The second conductor is coupled to collectors of the diodes which are not presently coupled to the first conductor. The diodes are successively coupled to the first conductor so that the first current causes the diodes, respectively, to produce relatively large $V_{BE}$ voltages on the first conductor and the second current causes sets of the diodes not coupled to the first conductor to produce relatively small $V_{BE}$ voltages on the second conductor. The relatively large and small $V_{BE}$ voltages provide differential band gap charges ($Q_{CA}$-$Q_{CB}$) which are averaged to provide a stable band gap reference voltage ($V_{REF}$).

20 Claims, 6 Drawing Sheets

US 8,324,881 B2

BANDGAP REFERENCE CIRCUIT WITH SAMPLING AND AVERAGING CIRCUITRY

BACKGROUND OF THE INVENTION

The present invention relates generally to bandgap reference voltage circuits, and more particularly to improvements therein which would improve accuracy by reducing sensitivity to random mismatching of internal components and sensitivity to temperature, long-term drift of input offset voltages, and mechanical stresses in integrated circuit chips in which the bandgap reference voltage circuits are formed.

FIG. 1A shows a conventional bandgap voltage reference circuit 1 which includes an amplifier 4 having its (+) input connected to the junction 2 between one terminal of a resistor R1 and the base and collector of a diode-connected NPN transistor Q5. Similarly, the (−) input of amplifier 4 is connected to the junction 3 between one terminal of a resistor R2 and one terminal of a resistor R3. The other terminal of resistor R3 is connected to the base and collector of a diode-connected NPN transistor Q4. The upper terminals of resistors R1 and R2 are connected by conductor 5 to the output of amplifier 4, on which a reference voltage $V_{REF}$ is generated. The emitters of transistors Q4 and Q5 are connected to supply voltage $V_{SS}$.

Conventional band gap reference circuits such as the one in Prior Art FIG. 1A generally have a serious problem of poor long term stability and wide chip-to-chip variation in the thermal drift of the generated reference voltage $V_{REF}$. Conventional band gap reference circuits typically provide trimming capability to adjust a "magic value" which is the actual band gap voltage $V_{BG}$ of the silicon and typically is 1.2 volts. The generated reference voltage $V_{REF}$ is a sum of a $V_{BE}$ voltage (base-to-emitter voltage) which is a CTAT voltage that is inversely proportional to absolute temperature and a $\Delta V_{BE}$ voltage which is a PTAT voltage (Proportional to Absolute Temperature) voltage that is directly proportional to absolute temperature. The $\Delta V_{BE}$ voltage is generated as a result of (1) forcing identical currents to flow through scaled diode-connected bipolar transistors Q4 and Q5 which, for example, have emitter areas that are scaled in the ratio of 1 to 8, (2) forcing scaled currents through identical diode-connected bipolar transistors Q4 and Q5, or (3) a combination of both of foregoing methods (1) and (2).

For most practical cases, the $\Delta V_{BE}$ voltage is smaller than the $V_{BE}$ voltage and needs to be amplified by a significant factor, typically about 6 to 20, depending on the way the two transistors and the emitter currents flowing through them are scaled. The amplification and addition of the two components $V_{BE}$ and $\Delta V_{BE}$ are performed by additional circuitry such as amplifier 4 and resistors R1, R2, and R3 in FIG. 1A. The output voltage produced by amplifier 4 is $V_{REF}=V_{BE}+N\times \Delta V_{BE}$, where N is a gain factor. It can be recognized from the foregoing equation that band gap reference circuit 1 in Prior Art FIG. 1A has high sensitivity to random causes such as component mismatches, various semiconductor chip material defects, temperature variations, long term input offset voltage drift, mechanical stress in the integrated circuit chip, and package stress imparted to the chip.

The high sensitivity to random mismatches occur because bandgap reference circuit 1 in Prior Art FIG. 1A uses scaled components to generate the necessary $\Delta V_{BE}$ voltage. For example, the emitter area of transistor Q5 may be 8 times smaller than the emitter area of transistor Q4 and is what mainly determines the overall sensitivity of band gap reference circuit 1 to the above mentioned random causes. If scaled current sources including resistor R1 and resistors R2 along with R3 are utilized, the one with the lower resistance (i.e., resistor R3) substantially affects the sensitivity of $V_{REF}$ to the random mismatches. The variation of the dominant sources of random error affects the value of the $\Delta V_{BE}$ voltage, which is multiplied by the above mentioned gain factor N to determine the generated reference voltage $V_{REF}$. The input offset voltage and drift of amplifier 4 are amplified by its gain and therefore increase the chip-to-chip variability of the generated reference voltage $V_{REF}$. The same small-area component (i.e., Q5) that dominates the sensitivity of $V_{REF}$ to random mismatch also is sensitive to back grind stress of the silicon chip on which the circuitry is formed and to package level stress.

Bandgap reference circuit 1 is difficult to optimize, because although reduction of the ratio of the emitter areas and emitter current densities of transistors Q4 and Q5 leads to better component matching, such reduction also reduces the value of the $\Delta V_{BE}$ voltage, so higher amplifier gain is required. That unfortunately results in higher variation of the generated reference voltage $V_{REF}$ due to the "gained-up" input offset voltage and associated drift of the offset voltage of amplifier 4, and hence results in higher noise in the generated reference voltage $V_{REF}$.

As indicated above, the emitter areas of large transistor Q4 and small transistor Q5 are scaled in order to generate the PTAT voltage across resistor R3, and only the smaller emitter area of transistor Q5 is mainly determinative of the random chip-to-chip variation $V_{REF}$. For example, if the ratio of the emitter areas of transistors Q4 and Q5 is 24, then transistor Q5 can be a single "unit transistor" with one "minimum unit" emitter area, and larger transistor Q4 can be composed of 24 parallel-connected unit transistors having a total of 24 unit emitter areas. That means the random chip-to-chip variation in the emitter area of only the single small transistor Q5, rather than the entire area of the array of all of the unit transistors, directly results in a corresponding random chip-to-chip variation in the output bandgap voltages produced by the band gap voltage reference circuit of FIG. 1A. (If there are multiple elements or devices in an array, the total variation of array parameters with respect to random variations of parameters of the individual elements or devices is significantly lower than the parameter variation of any single element or device of the array. For example, in Prior Art FIG. 1A, the emitter area of the small-area unit transistor Q5 varies much more than that of the large-area transistor Q4 because the transistor Q4 has the average characteristics of a large number of small-area unit transistors. The problem arises that, in order to generate the $\Delta V_{BE}$ voltage, it is necessary to use both a large-area transistor and a small-area transistor. But the random variation depends not much on the large-area transistor Q4 but mainly on the single small-area unit transistor Q5, and consequently there is no way to optimally reduce the effect of the single small-area unit transistor.) Operational amplifier 4 typically has a gain of approximately 10, and this causes its input offset voltage and drift of the input offset voltage to be multiplied by that gain. The gained-up input offset voltage is subject to the random chip-to-chip variation and consequently makes a significant contribution to the random variation of the generated reference voltage $V_{REF}$.

Prior Art FIG. 1B is a copy of FIG. 6 of commonly-assigned U.S. Pat. No. 7,511,648 entitled "Integrating SAR ADC and Method with Low Integrator Swing and Low Complexity", issued Mar. 31, 2009 to Trifonov et al., and incorporated herein by reference. Prior Art FIG. 1B shows and describes the structure and operation of known band gap voltage reference circuitry which includes basic band gap reference circuitry similar to that in Prior Art FIG. 1A along with an integrator 30 and a comparator 22. The integrator 30 works together with input sampling capacitors C0 and C1 and associated sampling switches SW1 and SW2. Comparator 22 controls the direction of integration.

Prior Art FIG. 1C is a copy of FIG. 3a of commonly assigned U.S. Pat. No. 7,504,977 entitled "Hybrid Delta-Sigma/SAR Analog to Digital Converter and Methods for Using Such", issued Mar. 17, 2009 to Doorenbos et al. and incorporated herein by reference. Prior Art FIG. 1C shows known switching circuitry similar to that in Prior Art FIG. 1B, including operational amplifier 412 and comparator 414. Comparator 414 controls the direction of integration of the sampled band gap reference voltage values applied to the inputs of operational amplifier 412.

Various dynamic element matching techniques are known wherein various matched circuit elements such as current sources, resistors, or capacitors in integrated circuit chips are "rotated" or successively connected into a particular circuit in order to, in effect, provide average values of various parameters of the matched circuit elements. This minimizes the sensitivity of the circuit including such matched circuit elements to random variations in their various parameters. Specifically, dynamic element matching of multiple current sources connected to each of a pair of identical diode-connected transistors has been utilized in temperature-sensing integrated circuits to reduce the sensitivity of the difference voltage $\Delta VB_{BE}$ between their base-emitter voltages to reduce random mismatches in their collector currents. Also, dynamic element matching of sampling capacitors has been used in the above mentioned temperature-sensing circuits to reduce the sensitivity of the temperature-sensing circuit to random mismatches in the sampling capacitors.

However, even though dynamic element matching techniques are widely used in many applications, such techniques nevertheless are unsuitable in many applications because dynamic element matching typically involves highly complex, very costly circuitry, slow circuit operation, and generation of ripple signals or tones which are very difficult and costly to deal with.

Various "curvature correction" circuits and techniques for band gap voltage reference circuits are known.

Thus, there is an unmet need for a band gap reference voltage circuit and method that substantially reduces random chip-to-chip variation in a band gap reference voltage generated thereby.

There also is an unmet need for a band gap reference voltage circuit and method that substantially reduces random chip-to-chip variation in a band gap reference voltage generated thereby without substantially increasing the size and/or power consumption of the circuit.

There also is an unmet need for a band gap reference voltage circuit and method that substantially reduces chip-to-chip variation in a band gap reference voltage generated thereby caused by random variations in the offset voltage and/or drift of an amplifier.

There also is an unmet need for a band gap reference voltage circuit and method that substantially reduces chip-to-chip variation in a band gap reference voltage generated thereby caused by random variations in the physical size of a single unit bipolar transistor utilized to generate a PTAT (proportional to absolute temperature) voltage utilized in generating the band gap reference voltage.

There also is an unmet need for a band gap reference voltage circuit and method wherein chip-to-chip variation in a band gap reference voltage generated thereby is dependent on the total amount of chip area required by an array of bipolar transistors or unit bipolar transistors, rather than on the size of a single unit bipolar transistor, utilized to generate a PTAT voltage on which the band gap reference voltage is based.

There also is an unmet need for a band gap reference voltage circuit which has low sensitivity to back-grind package stress and low random temperature drift.

There also is an unmet need for a band gap reference voltage circuit that is more easily optimized than those of the prior art.

SUMMARY OF THE INVENTION

It is an object of the invention to provide a band gap reference voltage circuit and method that substantially reduces random chip-to-chip variation in a band gap reference voltage generated thereby.

It is another object of the invention to provide a band gap reference voltage circuit and method that provide the best possible repeatability of a band gap reference voltage generated thereby without substantially increasing the size and/or power consumption of the circuit.

It is another object of the invention to provide a band gap reference voltage circuit and method that substantially reduces random chip-to-chip variation in a band gap reference voltage generated thereby without substantially increasing the size and/or power consumption of the circuit.

It is another object of the invention to provide a band gap reference voltage circuit and method that substantially reduces chip-to-chip variation in a band gap reference voltage generated thereby caused by random variations in the offset voltage and/or drift of an amplifier.

It is another object of the invention to provide a band gap reference voltage circuit and method that substantially reduces chip-to-chip variation in a band gap reference voltage generated thereby caused by random variations in the physical size of a single unit bipolar transistor utilized to generate a PTAT (proportional to absolute temperature) voltage utilized in generating the band gap reference voltage.

It is another object of the invention to provide a band gap reference voltage circuit and method wherein chip-to-chip variation in a band gap reference voltage generated thereby is dependent on the total amount of chip area required by an array of bipolar transistors or unit bipolar transistors, rather than on the size of a single unit bipolar transistor, utilized to generate a PTAT voltage on which the band gap reference voltage is based.

It is another object of the invention to provide a band gap reference voltage circuit which has low sensitivity to back grind, package stress, and low random temperature drift.

It is another object of the invention to provide a band gap reference voltage circuit that is more easily optimized than those of the prior art.

Briefly described, and in accordance with one embodiment, the present invention provides a circuit for generating a band gap reference voltage ($V_{REF}$) including circuitry ($I_3 \times 7$) for supplying a first current to a first conductor (NODE1) and a second current to a second conductor (NODE2). The first conductor is successively coupled to a plurality of diodes (Q0×16), respectively, in response to a digital signal (CTL-VBE) to cause the first current to successively flow into selected diodes. The second conductor is coupled to the diodes which are not presently coupled to the first conductor. The diodes are successively coupled to the first conductor so that the first current causes the diodes, respectively, to produce relatively large $V_{BE}$ voltage on the first conductor and the second current causes the diodes not coupled to the first conductor to produce relatively small $V_{BE}$ voltages on the second conductor. The relatively large and small $V_{BE}$ voltages provide differential band gap charges ($Q_{CA}$-$Q_{CB}$) which are averaged to provide a stable band gap reference voltage ($V_{REF}$).

In one embodiment, the invention provides a band gap voltage reference circuit (10) including a band gap reference generator circuit (12) that includes current source circuitry ($I_3 \times 7$) for supplying a first current to a first conductor (NODE1) and a second current to a second conductor (NODE2). A plurality of diodes (Q0×16) each has a cathode terminal coupled to a first reference voltage ($V_{SS}$). A first group of switches (MN7×16) selectively couples the first conductor (NODE1) to anode terminals of the diodes (Q0×16), respectively, in response to a first digital control signal (CTL-VBE) to cause the first current to flow into a selected diode (Q0). A second group of switches (MN4×16) selectively couples the second conductor (NODE2) to anode terminals of the diodes (Q0×16) which are not selectively coupled to the first conductor (NODE1) in response to the first digital control signal CTL-VBE) to cause the second current to flow into and be shared among the diodes (Q0×16) which are not selectively coupled to the first conductor (NODE1). The first control signal (CTL-VBE) has values which cause the diodes (Q0×16) to be successively coupled to the first conductor (NODE1) so that the first current causes the diodes (Q0×16), respectively, to produce corresponding relatively large $V_{BE}$ voltages ($V_{PTATP}$) on the first conductor (NODE1) and the second current causes the successively coupled diodes (Q0×16) not coupled to the first conductor (NODE1) to produce corresponding relatively small $V_{BE}$ voltages ($V_{PTATN}$) on the second conductor (NODE2). The difference between each relatively large $V_{BE}$ voltage and a corresponding relatively small $V_{BE}$ voltage is equal to a corresponding $\Delta V_{BE}$ voltage. Sampling circuitry (35) for sampling the relatively large $V_{BE}$ voltages ($V_{PTFAP}$) and the relatively low $V_{BE}$ voltages ($V_{PTATN}$) operates to generate differential band gap charges ($Q_{CA}$-$Q_{CB}$). Averaging circuitry (30) coupled by first (16) and second (17) output conductors of the sampling circuitry (35) receives the differential band gap charges ($Q_{CA}$-$Q_{CB}$) and operates to average successive differential band gap charges ($Q_{CA}$-$Q_{CB}$) to provide a stable band gap reference voltage ($V_{REF}$). In the described embodiments, a switch controller (20) generates the first control signal (CTL-VBE).

In one embodiment, each diode is an NPN diode-connected transistor. Each anode terminal includes a collector of a diode-connected transistor, and each cathode terminal includes an emitter of a diode-connected transistor. The current source circuitry includes a plurality of unit current sources ($I_3 \times 7$) each delivering a unit current ($I_3$), and each of the diode-connected transistors (Q0×16) is a unit transistor (Q0). The band gap voltage reference generator circuit (12) includes a third group of switches (MP0×7) for selectively coupling the first conductor (NODE1) to the unit current sources ($I_3 \times 7$), respectively, in response to a second digital control signal (CTL-ISOURCE) to produce the first current, and also includes a fourth group of switches (MP2×7) for selectively coupling the second conductor (NODE2) to the unit current sources ($I_3 \times 7$) which are not selectively coupled to the first conductor (NODE1) in response to the second digital control signal (CTL-ISOURCE) to produce the second current. A third conductor (18) is coupled to the switches of the first group (MN7×16), the switches of the second group (MN4×16), switches of a fifth group (MN5×16), and switches of a sixth group (MN0×16). The switches of the fifth group (MN5×16) couple a fourth conductor (NODE PTATP) to the third conductor (18) in response to the first digital control signal (CTL-VBE) to avoid voltage drop errors across the transistors of the first group (MN7×16), and the switches of the sixth group (MN0×16) couple a fifth conductor (NODE PTATN) to the third conductor (18) in response to the first digital control signal (CTL-VBE) to avoid voltage drop errors across the transistors of the second group (MN4×16).

In a described embodiment, a switch controller (20) generates the second digital control signal (CTL-ISOURCE) such that the unit current sources ($I_3 \times 7$) are successively coupled to the second conductor (NODE2) to generate the relatively small $V_{BE}$ voltages on the second conductor (NODE2), such that the unit current sources ($I_3 \times 7$) not coupled to the second conductor (NODE2) generate the relatively large $V_{BE}$ voltages on the first conductor (NODE1), thereby producing the $\Delta V_{BE}$ voltages.

In a described embodiment, the sampling circuitry (35) includes a first group of sampling capacitors (C2×10) and a second group of sampling capacitors (C3×10), for sampling the relatively large $V_{BE}$ voltages ($V_{PTATP}$) and the relatively small $V_{BE}$ voltages ($V_{PTATN}$) to produce a first output charge ($Q_{CA}$) and a second output charge ($Q_{CB}$). The first ($Q_{CA}$) and second ($Q_{CB}$) output charges are applied as inputs to the averaging circuitry (30), differences between corresponding first ($Q_{CA}$) and second ($Q_{CB}$) output charges being equal to the differential band gap charges ($Q_{CA}$-$Q_{CB}$), respectively.

In one embodiment, the transistors are unit transistors (Q0), and the number (N) of unit transistors (Q0×16) is equal to 16. In one embodiment, the transistors are unit transistors (Q0), and the number (N) of unit transistors (Q0×16) is equal to 16 and the number (M) of unit current sources ($I_3 \times 7$) is equal to 7.

In one embodiment, the switch controller (20) generates a plurality of digital control signals as control inputs to various switches coupled to the sampling capacitors of the first (C2×10) and second (C3×10) groups of sampling capacitors to rotate sampling capacitors in each of the first (C2×10) and second (C3×10) groups of sampling capacitors a predetermined number (L=5) of times for each sampling of the relatively large $V_{BE}$ voltages ($V_{PTATP}$) and the relatively small $V_{BE}$ voltages ($V_{PTATN}$).

In one embodiment, the sampling circuitry (35) includes a first trimming capacitor (C1) coupled by a first switch (MN15) to the fourth conductor (NODE PTATP) in response to a first digital trim signal (CTL-TRPA) and also coupled by a second switch (MN12) to the fifth conductor (NODE PTATN) in response to a second digital trim signal (CTL-TRNA). The sampling circuitry (35) also includes a second trimming capacitor (C0) coupled by a third switch (MN10) to the fourth conductor (NODE PTATP) in response to a third digital trim signal (CTL-TRPB) and also coupled by a fourth switch (MN11) to the fifth conductor (NODE PTATN) in response to a fourth digital trim signal (CTL-TRNB).

In one embodiment, curvature correction circuitry (42) is coupled to generate curvature correction charges in the first (16) and second (17) output conductors of the sampling circuitry (35) to correct curvature in the differential band gap charges ($Q_{CA}$-$Q_{CB}$).

In one embodiment, the band gap reference generator circuit (12) includes a first group of inverters (INV9×16) each having an input coupled to the first digital control signal (CTL-VBE) and an output coupled to control terminals of corresponding switches of the second (MN4×16) and sixth (MN0×16) groups, the first digital control signal (CTL-VBE) being coupled directly to control terminals of corresponding switches of the first (MN7×16) and fifth (MN5×16) groups. The band gap reference generator circuit (12) also includes a second group of inverters (INV0×7) each having an input coupled to the second digital control signal (CTL-ISOURCE) and an output coupled to a control terminal of a corresponding switch of the fourth group (MP2×7), the second digital control signal (CTL-ISOURCE) being coupled directly to control terminals of switches of the third group (MP0×7).

In one embodiment, the invention provides a method for generating a band gap reference voltage ($V_{REF}$), including supplying a first current to a first conductor (NODE1) and supplying a second current to a second conductor (NODE2); successively coupling the first conductor (NODE1) to anode terminals of a plurality of diodes (Q0×16), respectively, in response to successive values of a first digital control signal (CTL-VBE) to cause the first current to successively flow into the diodes (Q0), respectively; successively coupling the second conductor (NODE2) to anode terminals of successive groups of the diodes (Q0×16) not selectively coupled to the first conductor (NODE1) in response to the successive values, respectively, of the first digital control signal (CTL-VBE) to cause the second current to flow into and be shared among the diodes (Q0×16) of each of the groups, respectively; wherein the first current causes the diodes (Q0×16), respectively, to successively produce corresponding relatively large $V_{BE}$ voltages ($V_{PTATP}$) on the first conductor (NODE1) and the second current causes the successive groups of the diodes (Q0×16) not selectively coupled to the first conductor (NODE1) to successively produce corresponding relatively small $V_{BE}$ voltages ($V_{PTATN}$) on the second conductor (NODE2), a difference between each relatively large $V_{BE}$ voltage and corresponding relatively small $V_{BE}$ voltage being equal to a corresponding $\Delta V_{BE}$ voltage; successively sampling the relatively large $V_{BE}$ voltages ($V_{PTATP}$) and relatively low $V_{BE}$ voltages ($V_{PTATN}$) to generate corresponding differential band gap charges ($Q_{CA}$-$Q_{CB}$); and averaging the successive differential band gap charges ($Q_{CA}$-$Q_{CB}$) to provide a stable band gap reference voltage ($V_{REF}$).

In one embodiment, each diode is an NPN diode-connected transistor, and each anode terminal includes a collector of a diode-connected transistor, and each cathode terminal includes an emitter of a diode-connected transistor, and each of the diode-connected transistors (Q0×16) is a unit transistor (Q0), wherein the method includes successively coupling the first conductor (NODE1) to a plurality of unit current sources ($I_3$×7), respectively, in response to successive values of a second digital control signal (CTL-ISOURCE) to produce the first current, and wherein the method also includes successively coupling the second conductor (NODE2) to the unit current sources ($I_3$×7) not selectively coupled to the first conductor (NODE1) in response to the successive values of the second digital control signal (CTL-ISOURCE) to produce the second current.

In one embodiment, the method includes operating a switch controller (20) to generate the first (CTL-VBE) and second (CTL-ISOURCE) digital control signals such that the unit current sources ($I_3$×7) are successively coupled to the second conductor (NODE2) to generate the relatively small $V_{BE}$ voltages on the second conductor (NODE2), and such that the unit current sources ($I_3$×7) not coupled to the second conductor (NODE2) generate the relatively large $V_{BE}$ voltages on the first conductor (NODE1), thereby producing the $\Delta V_{BE}$ voltages.

In one embodiment, the method includes operating sampling circuitry (35) to successively receive corresponding relatively large $V_{BE}$ voltages ($V_{PTATP}$) and relatively small $V_{BE}$ voltages ($V_{PTATN}$) to produce the successive values of the corresponding differential band gap charges ($Q_{CA}$-$Q_{CB}$), wherein the switch controller (20) generates a plurality of digital control signals as inputs to control various switches coupled to first (C2×10) and second (C3×10) groups of sampling capacitors so as to rotate sampling capacitors (C2×10) of the first group a predetermined number (L=5) of times for each sampling of each value of the relatively large $V_{BE}$ voltages ($V_{PTATP}$) and the relatively small $V_{BE}$ voltages ($V_{PTATN}$) so as to rotate sampling capacitors (C3×10) of the second group the predetermined number (L=5) of times for each sampling of each value of the relatively large $V_{BE}$ voltages ($V_{PTATP}$) and the relatively small $V_{BE}$ voltages of ($V_{PTATN}$).

In one embodiment, the invention provides a circuit for generating a band gap reference voltage ($V_{REF}$), including means ($I_3$×7) for supplying a first current to a first conductor (NODE1) and supplying a second current to a second conductor (NODE2); means (MN7×16) for successively coupling the first conductor (NODE1) to collectors of a plurality of bipolar diode-connected transistors (Q0×16), respectively, in response to a first digital control signal (CTL-VBE) to cause the first current to successively flow into a selected diode-connected transistor (Q0); means (MN4×16) for successively coupling the second conductor (NODE2) to collectors of the diode-connected transistors (Q0×16) which are not presently selectively coupled to the first conductor (NODE1) in response to the first digital control signal (CTL-VBE) to cause the second current to flow into and be shared among the transistors (Q0×16) which are not selectively coupled to the first conductor (NODE1); means (20) for generating the first control signal (CTL-VBE) such that the transistors (Q0×16) are successively coupled to the first conductor (NODE1) so that the first current causes the transistors (Q0×16), respectively, to produce corresponding relatively large $V_{BE}$ voltages ($V_{PTATP}$) on the first conductor (NODE1) and the second current causes sets of the transistors (Q0×16) not coupled to the first conductor (NODE1) to produce corresponding relatively small $V_{BE}$ voltages ($V_{PTATN}$) on the second conductor (NODE2), a difference between each relatively large $V_{BE}$ voltage and the corresponding relatively small $V_{BE}$ voltage being equal to a corresponding $\Delta V_{BE}$ voltage; means (35) for successively sampling the relatively large $V_{BE}$ voltages ($V_{PTATP}$) and relatively low $V_{BE}$ voltages ($V_{PTATN}$) to generate corresponding differential band gap charges ($Q_{CA}$-$Q_{CB}$); and means (30) for averaging the successive differential band gap charges ($Q_{CA}$-$Q_{CB}$) to provide a stable band gap reference voltage ($V_{REF}$).

DETAILED DESCRIPTION OF THE PREFERRED EMBODIMENTS

Figure 2B:
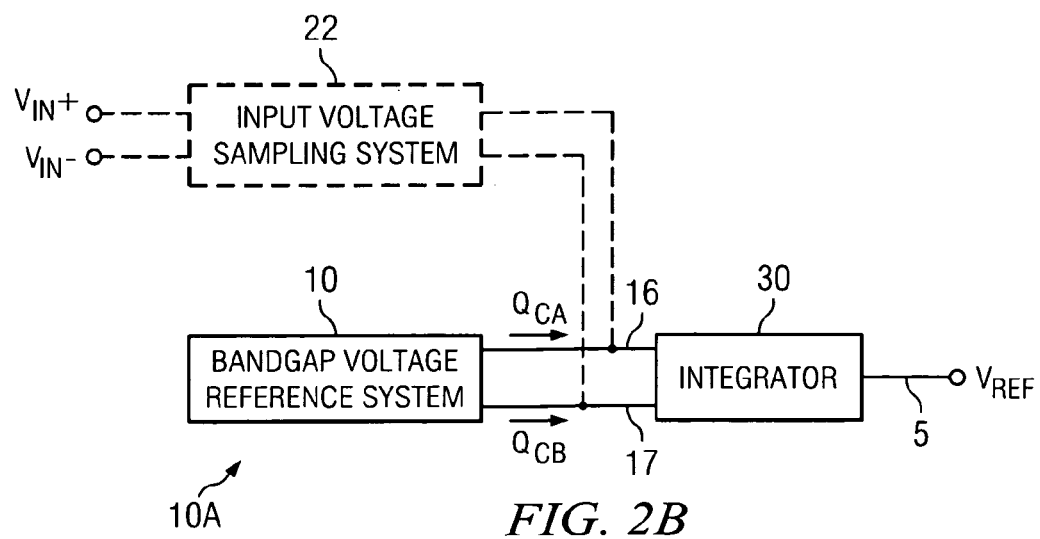
FIG. 2B is a block diagram of a band gap voltage reference circuit including the circuitry of FIG. 2A and an integrator.
Figure 2A:
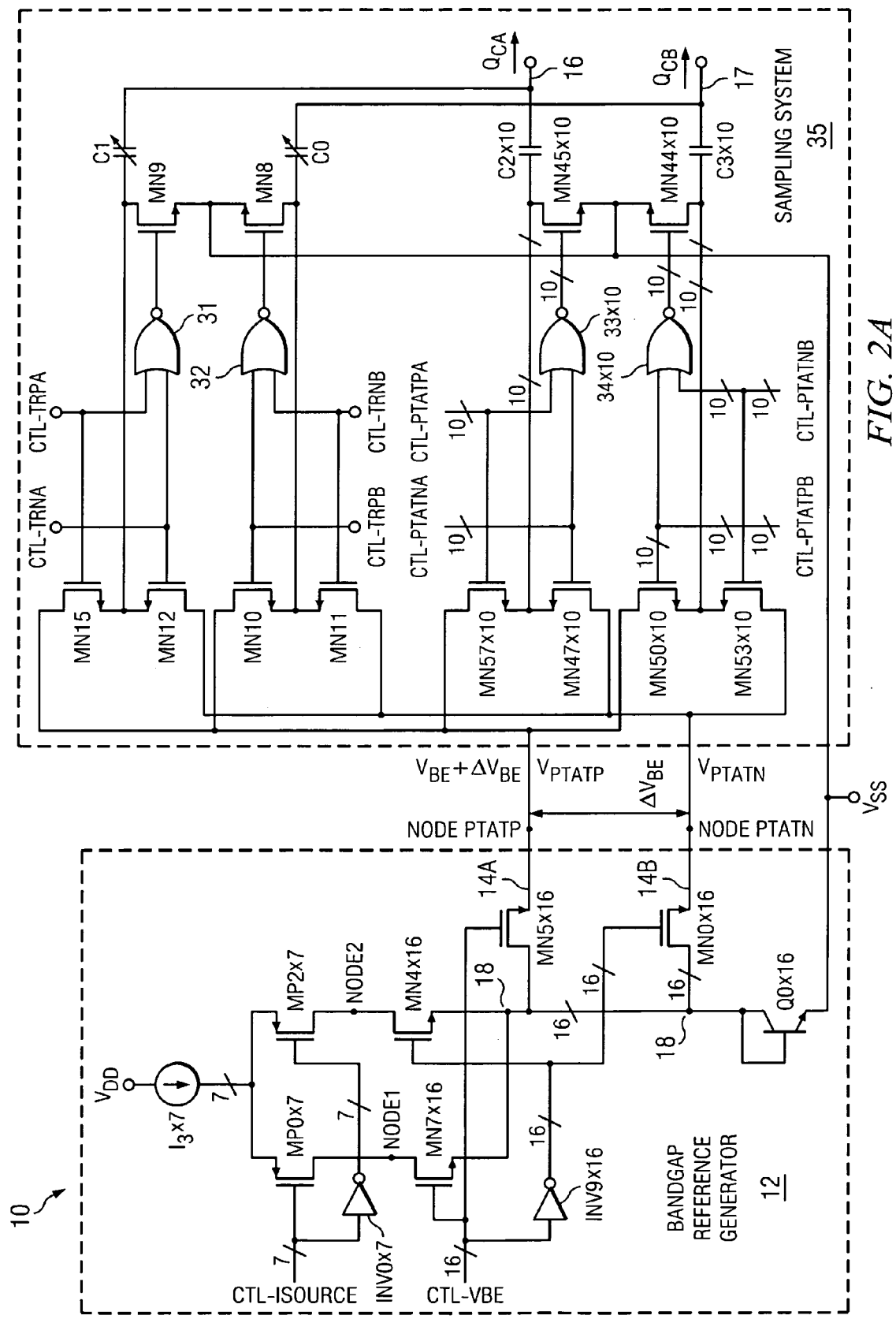
FIG. 2A is a schematic diagram of the bandgap voltage reference circuit of the present invention.

Structure of FIG. 2A, block 12

FIG. 2A shows a bandgap voltage reference system 10 with dynamic element matching to reduce circuit inaccuracy due to normal variations in parameters of various circuit components. Voltage reference system 10 includes a bandgap reference generator circuit 12, the output of which is coupled to a dynamic sampling system 35. In this example, reference generator circuit 12 includes M=7 identical current sources $I_3$, collectively designated "$I_3 \times 7$". Each of the 7 current sources $I_3$ has one terminal connected to $V_{DD}$ and another terminal connected to the source of a corresponding P-channel transistor MP0 and also to the source of another corresponding P-channel transistor MP2. The 7 transistors MP0 are collectively designated "MP0×7", and the 7 transistors MP2 are collectively designated "MP2×7". The gates of transistors MP0×7 are connected to the 7 conductors, respectively, of a bus which conducts the M=7 bits of a digital control signal CTL-ISOURCE, and are also connected, respectively, to the inputs of 7 corresponding inverters collectively designated "INV0×7". The outputs of the 7 inverters INV0×7 are connected to the gates of the 7 transistors MP2×7, respectively.

The drains of transistors MP0×7 all are connected to a single conductor designated "NODE1", and the drains of transistors MP2×7 all are connected to a single conductor designated "NODE2". NODE1 is also connected to the drains of N=16 N-channel transistors collectively designated "MN7×16", the gates of which are connected to the N=16 conductors, respectively, of a bus conducting a digital signal CTL-VBE. The gates of transistors MN7×16 also are connected to the inputs of N=16 inverters designated "INV9×16". NODE2 is connected to the drains of 16 N-channel transistors collectively designated "MN4×16", the gates of which are connected to the outputs of the 16 inverters INV9×16, respectively. The source of each of the 16 transistors MN7×16 is connected by a corresponding one of N=16 conductors of an intermediate bus 18 to the collector and base of a corresponding one of 16 diode-connected NPN transistors which are collectively designated "Q0×16", the drain of a corresponding one of 16 N-channel transistors collectively designated "MN5×16", and the drain of a corresponding one of 16 N-channel transistors collectively designated "MN0×16". The emitters of transistors Q0×16 are connected to $V_{SS}$. Each of transistors Q0×16 is a "unit transistor" having a "unit emitter area".

The 7-bit bus CTL-ISOURCE controls rotation of the 7 current sources $I_3$ so that each in turn becomes the single transistor current source $I_3$ flowing through NODE2 into 15 parallel diode-connected transistors Q0 while the other 6 current sources $I_3$ flow through NODE1 into a single diode-connected transistor Q0. The bus CTL-VBE controls switches MN7×16 and MN4×16 so that 15 diode-connected transistors Q0 are presently connected to NODE2 and one single "rotated" transistor Q0 is presently connected to NODE1. Rotation of each one of the six $I_3 \times 7$ unit current sources is achieved by setting 6 bits of CTL-ISOURCE to "0"s and the remaining one bit to a "1" so that a large current equal to $6 \times I_3$ flows through NODE1 into the relatively small unit emitter area of a single diode-connected transistor Q0. Inverters INV0×7 cause P-channel transistors MP2×7 to be turned on when P-channel transistors MP0×7 are turned off by "1"s in the digital signal CTL-ISOURCE, and vice versa (i.e., inverters INV0×7 also cause P-channel transistors MP2×7 to be turned off when P-channel transistors MP0×7 are turned on by "0"s in CTL-ISOURCE). Similarly, inverters INV9×16 cause N-channel transistors MN4×16 and MN0×16 to be turned on when N-channel transistors MN7×16 and MN5×16 are turned off by "0"s in CTL-VBE, and so forth.

Similarly, the sources of the 16 transistors MN4×16 also are connected to the corresponding 16 conductors, respectively, of intermediate bus 18. The sources of transistors MN5×16 are connected to the single conductor designated NODE PTATP, and the sources of transistors MN0×16 are connected to the single conductor designated NODE PTATN. The voltage on NODE PTATP is $V_{PTATP}$ and the voltage on NODE PTATN is $V_{PTATN}$.

The additional switches MN5×16 and MN0×16 are controlled by CTL-VBE to connect the single diode-connected transistor Q0 to NODE PTATP and the other 15 diode-connected transistors Q0 to NODE PTATN. This arrangement of switches provides "force-current/sense-voltage connection" between the current sources $I_3 \times 7$ and the bipolar transistors in the Q0×16 array and, as described below, eliminates error due to the voltage drop across the switches MN7×16 and MN4×16.

The bus CTL-VBE is controlled so as to successively "rotate" all of the bipolar transistors in the Q0×16 array, one at a time, so that each in turn becomes the single unit transistor Q0 that absorbs the large current $6 \times I_3$ from NODE1 and generates a value of $V_{BE}$ voltage $V_{PTATP}$ which appears on NODE PTATP. As a result, that one diode-connected bipolar transistor Q0 (having only a single relatively small total unit emitter area) with a relatively large current equal to 6 unit currents $I_3$ flowing through it, is connected to NODE PTATP to generate the relatively large $V_{BE}$ voltage $V_{PTATP}$. The remaining 15 bipolar diode-connected transistors Q0, with a total of 15 unit emitter areas among which only a single 1-unit current is essentially equally divided are connected to NODE PTATN to generate the relatively small $V_{BE}$ voltage $V_{PTATN}$.

In response to the digital signal CTL-ISOURCE, 6 of the current sources $I_3 \times 7$ are simultaneously coupled to NODE1, and 1 of them is coupled to NODE2, so most (i.e., $6 \times I_3$) of the total current from current sources $I_3 \times 7$ goes to NODE1 and therefore to the collector and base of a single diode-connected transistor Q0. Simultaneously, in response to the digital signal CTL-VBE, 15 of the diode-connected transistors Q0×16 are coupled to NODE2, and 1 of them is coupled to NODE1, so very little (i.e., $1 \times I_3$) of the total current from current sources $I_3 \times 7$ goes to NODE2 and therefore is essentially equally shared among the other 15 parallel-connected diode-connected transistors Q0. This results in a relatively large $V_{BE}$ voltage, which is equal to $V_{PTATP}$, and a relatively low $V_{BE}$ voltage, which is equal to $V_{PTATN}$. Thus, there is a first CTAT $V_{BE}$ voltage on NODE PTATP and a second CTAT $V_{BE}$ voltage on NODE PTATN. Simultaneously, there is a PTAT voltage difference $\Delta V_{BE}$ between $V_{PTATP}$ and $V_{PTATN}$. Since the voltage $V_{PTATP}$ is the sum of $V_{PTATN}$ and $\Delta V_{BE}$, it is more convenient to use the voltage $V_{PTATP}$ for constructing a band gap reference voltage. The difference between the two $V_{BE}$ voltages $V_{PTATP}$ and $V_{PTATN}$ is the $\Delta V_{BE}$ voltage to be sampled in the manner subsequently described.

Thus, band gap voltage reference circuit 10 shown in FIG. 2A is based on an array (a 16-element array, more generally an N-element array) of diode-connected NPN transistors Q0 and an array (a 7-element array, more generally an M-element array) of current sources $I_3$. The current sources $I_3$ are connected to NODE1 and NODE2 through switches MP0×7 and MP2×7 so that 6 currents flow through NODE1 to a single unit transistor Q0 and only one current flows through NODE2 to 6 parallel unit transistors Q0. This allows the design of band gap voltage reference circuit 10 to be readily optimized. This is because the random mismatching is not dependent on a single component. If a larger $V_{BE}$ voltage is needed, the ratio of the transistors may be substantially increased, but the random variation of the generated reference voltage may not increase and may actually decrease because a larger number of bipolar transistors may be used whereby the amount of random variation depends on the entire array of bipolar transistors. This causes the amount of random variation to be disassociated from the scaling in the voltage reference circuit so that the two are not related in such a way that the amount of random variation depends on one single unit transistor.

Structure of FIG. 2A, Block 35

In sampling circuit 35 of FIG. 2A, an array of unit capacitors C2×10, C3×10, C1 and C0 can be coupled to $V_{PTATP}$, $V_{PTATN}$ and $V_{SS}$ by means of the array of switches including MN44×10, MN45×10, MN47×10, MN50×10, MN53×10, MN57×10, MN8, MN9, MN10, MN11, MN12, and MN15.

Sampling system 35 in FIG. 2A includes a N-channel transistor MN15 having its drain coupled by NODE PTATP to the drain of each of N-channel transistor MN 10, 10 N-channel transistors designated "MN57×10", and 10 N-channel transistors designated "MN50×10". The gate of transistor MN15 is connected to a digital control signal CTL-TRPA and one input of a NOR gate 31. The source of transistor MN15 is connected to the source of a N-channel transistor MN 12, the drain of a N-channel transistor MN9, and one terminal of a trimming capacitor C1. The other terminal of capacitor C1 is connected to conductor 16. The gate of transistor MN12 is connected to a digital signal CTL-TRNA and to the other input of NOR gate 31. The output of NOR gate 31 is connected to the gate of transistor MN9. The source of transistor MN9 is connected to $V_{SS}$. The drain of transistor MN12 is connected by NODE PTATN to the drains of each of N-channel transistor MN11, 10 N-channel transistors designated "MN47×10", and 10 N-channel transistors designated MN53×10. The gate of transistor MN10 is connected to digital signal CTL-TRPB and to one input of a NOR gate 32, the output of which is connected to the gate of a N-channel transistor MN8. The source of transistor MN8 is connected to $V_{SS}$. The source of transistor MN10 is connected to the source of N-channel transistor MN11, the drain of transistor MN8, and one terminal of trimming capacitor C0, the other terminal of which is connected to conductor 17. The gate of transistor MN11 is connected to digital signal CTL-TRNB and the other input of NOR gate 32.

The gates of the 10 transistors MN57×10 are connected to the 10 bits, respectively, of digital signal CTL-PTATPA and to a first input of each of 10 NOR gates designated "33×10", respectively. The outputs of the 10 NOR gates 33×10 are connected, respectively, to the gates of 10 N-channel transistors designated "MN45×10" all having their sources connected to $V_{SS}$. The drains of transistors MN45×10 are connected, respectively, to the sources of transistors MN57×10 and one terminal of each of 10 capacitors designated "C2×10" and also to the sources of transistors MN47×10. The other terminal of each of capacitors C2×10 is connected to conductor 16.

The gates of the 10 transistors MN47×10 are connected to the 10 bits, respectively of digital signal CTL-PTATNA and to a second input of each of the 10 NOR gates 33×10, respectively. The gates of the 10 transistors MN50×10 are connected to the 10 bits, respectively of digital signal CTL-PTATPB and to a first input of each of 10 NOR gates designated "34×10", respectively. The outputs of the 10 NOR gates 34×10 are connected, respectively, to the gates of 10 N-channel transistors designated "MN44×10" all having their sources connected to $V_{SS}$. The drains of transistors MN44×10 are connected, respectively, to the sources of transistors MN50×10 and one terminal of each of 10 capacitors designated "C3×10" and also to the sources of transistors MN53×10. The other terminal of each of capacitors C3×10 is connected to conductor 17. The gates of the 10 transistors MN53×10 are connected to the 10 bits, respectively of digital signal CTL-PTATNB, and to a second input of each of the 10 NOR gates 34×10, respectively.

In FIG. 2A, $V_{BE}$ and $\Delta V_{BE}$ voltages sampled onto capacitors C2×10 result in corresponding band gap charges $Q_{CA}$ being transferred via conductor 16 to a first input of an integrator 30 as shown in FIG. 2B. Simultaneously, the $V_{BE}$ and $\Delta V_{BE}$ voltages sampled onto capacitors C3×10 result in corresponding band gap charges $Q_{CB}$ being transferred via conductor 17 to the second input of integrator 30, as subsequently described.

Referring to FIG. 2B, band gap voltage reference system 10A includes band gap voltage reference system 10 of FIG. 2A with differential band gap charges $Q_{CA}$-$Q_{CB}$ being fed via conductors 16 and 17 into integrator 30. Integrator 30 can be the same as the integrator 30 shown in Prior Art FIG. 1B. In one application, band gap reference voltage system 10A can be coupled to an input voltage sampling system 22 as indicated by the dashed lines in FIG. 2B. In this case, the charges obtained by sampling external input voltages Vin+ and Vin− are combined with charges $C_{CA}$ and $Q_{CB}$, respectively, so that integrator 30 contributes to an analog to digital conversion of the external differential input voltage Vin+-Vin−.

Figure 2C:
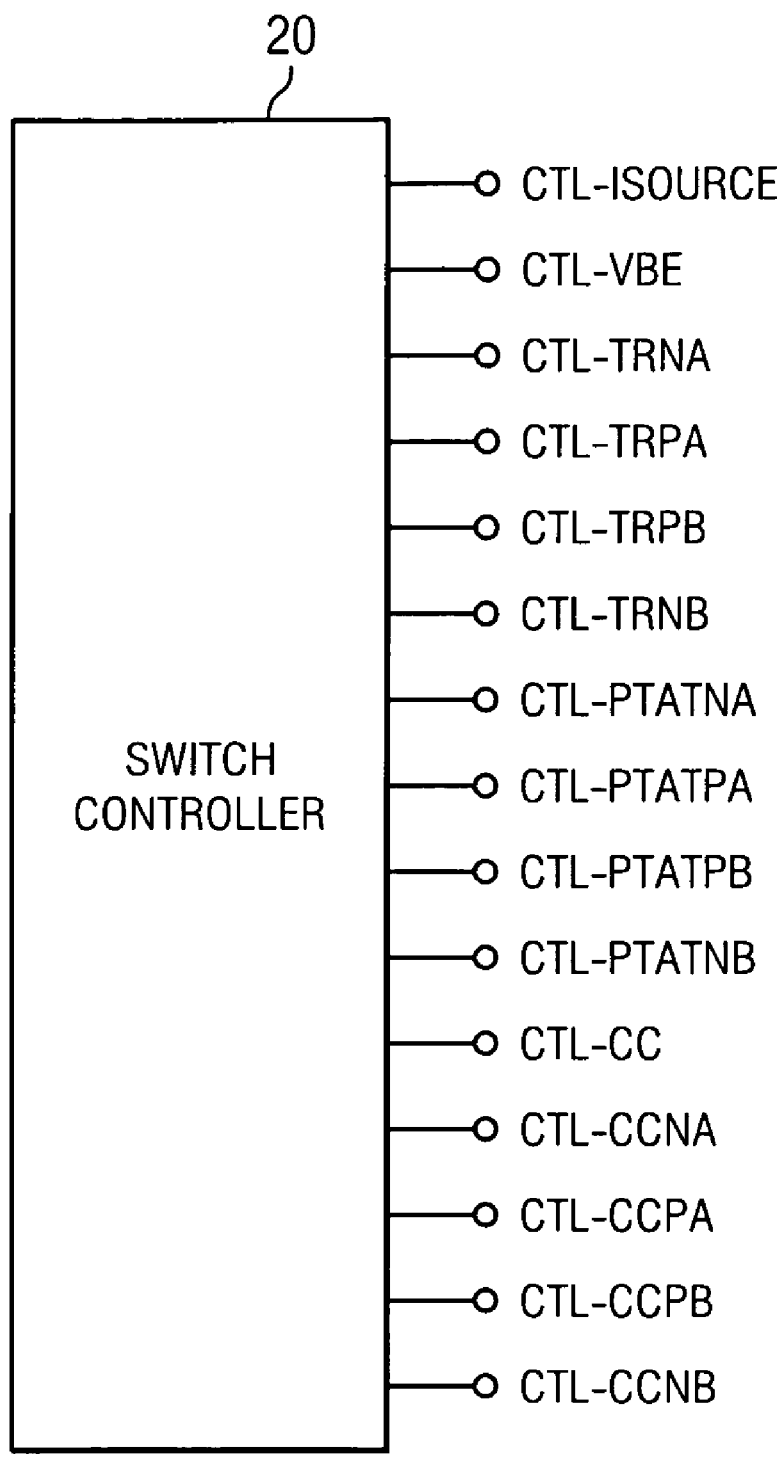
FIG. 2C is a block diagram of a switch controller generating the control signals in FIG. 2A.

FIG. 2C shows a switch controller 20 which generates all of the above mentioned digital control signals in FIG. 2A, and also the subsequently mentioned control signals in FIG. 3. Such a switch controller can be readily implemented in many different ways, for example by means of a state machine or various binary counters.

Operation of FIG. 2A, Block 12

Figure 1A:
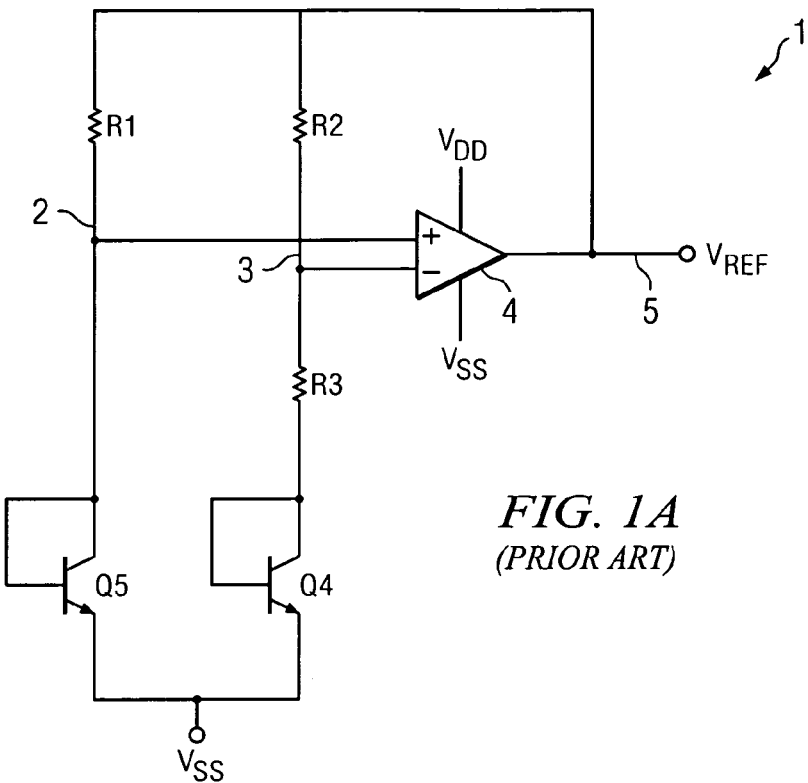
FIG. 1A is a schematic diagram of a conventional band gap voltage reference circuit.

The values of the $V_{BE}$ and $\Delta V_{BE}$ voltages at any given time are just as sensitive to mismatch, stress, and defects as is the case in the basic circuit shown in Prior Art FIG. 1A. What makes the circuit of FIG. 2A less sensitive to the above mentioned component mismatches, semiconductor chip material defects, temperature variations, long term input offset voltage drift, and mechanical stress is the use of dynamic element matching "rotation" of currents $I_3$×7 and bipolar transistors Q0×16. To reduce such sensitivity, the control bus CTL-ISOURCE rotates every current source $I_3$×7 so each in turn becomes the unit current source on NODE1, and the control bus CTL-VBE rotates every bipolar transistor so each in turn becomes the unit transistor connected to NODE PTATP. The rotation is performed so that there are M×N combinations of a single transistor Q0 with a current equal to (M−1)×$I_3$ flowing through it, where M is the number of unit current sources $I_3$ and N is the number of unit diode-connected transistors Q0.

Each time integrator 30 of band gap voltage reference system 10A in FIG. 2B needs to generate a new value of the reference voltage $V_{REF}$, a new value of the differential band gap reference charge $Q_{CA}$-$Q_{CB}$ is first sampled and then transferred by sampling capacitors C2×10 and C3×10 to the input of integrator 30. That new value of differential band gap charge $Q_{CA}$-$Q_{CB}$ is obtained by sampling the present above mentioned $V_{BE}$ and $\Delta V_{BE}$ voltages. Each sampling causes a new intermediate or momentary value of the reference voltage $V_{REF}$ to be generated on the output 5 of integrator 30 in FIG. 2B, until all integrations of the M×N×L possible combinations of the $I_3$×M currents, the Q0×N diode-connected bipolar transistors, and the L capacitive sampling combinations have been performed to thereby provide an average of the sampled $V_{BE}$ and $\Delta V_{BE}$ voltages. In this example, M=7, N=16, and L=5.

When all of the rotations have been completed and the corresponding values of differential band gap charge $Q_{CA}$-$Q_{CB}$ have been integrated so as to provide averaged values of $V_{BE}$ and $\Delta V_{BE}$, the resulting averaged value of $V_{REF}$ generated by integrator 30 is relatively insensitive to random mismatching of internal components of band gap voltage reference circuit 10A and also is relatively insensitive to temperature, long-term drift of input offset voltages and mechanical stresses in integrated circuit chips in which the bandgap reference voltage circuits are formed.

To obtain each new value of differential band gap charge $Q_{CA}-Q_{CB}$, an additional rotation of a next one of transistors Q0×16 is performed by providing a next value of CTL-VBE. A next value of another one of current sources $I_3$×7 is selected by a next value of CTL-ISOURCE to flow via NODE2 through the other 15 transistors Q0; the other 6 current sources $I_3$ flow through NODE1 to the single rotated transistor Q0. Then the foregoing sampling of the new values of $V_{BE}$ and $\Delta V_{BE}$ is performed to provide the next corresponding value of $Q_{CA}-Q_{CB}$ as the next input value for integrator 30.

The previously mentioned 16 transistors MN7 and 16 transistors MN5, and also 16 transistors MN4 and 16 transistors MN0 are operated in pairs to eliminate the errors due to the IR voltage drop across the transistors MN7 and MN4. The voltage drop across each transistor MN7 due to the 6×$I_3$ current flowing through it produces additional error. In order to avoid this error, the two sets of 16 corresponding transistors MN7×16 and MN5×16 are provided. This "double switch" arrangement allows the $V_{BE}$ voltage across the bipolar transistors Q0 to be directly sensed so as to eliminate the above mentioned error due to IR drops across the transistors MN7×16. When one of the MN7×16 transistors is turned on, i.e., enabled, that transistor provides a connection from NODE1 to the base and collector of one of the 16 bipolar diode-connected transistors Q0×16, and at the same time the voltage on the selected single transistor Q0 is provided through MN5×16 toward the capacitor array in sampling system 35. The voltage on the collector and base of the selected single diode-connected transistor Q0 is directly sensed through the corresponding transistor MN5×16 because there is no current flowing through it since the sources of the transistors MN5 ×16 are connected only to a capacitive load. (This can be considered to be force-sensing the corresponding diode-connected bipolar transistor.) Transistors MN4×16 and MN0×16 work in a similar way to allow direct sensing of the collector and base voltage of the remaining 15 transistors Q0×16 which are coupled to NODE2 by the 15 corresponding transistors MN0×16, because there is no current flowing through them since the sources of the transistors MN0×16 are connected only to a capacitive load.

FIG. 2A, Operation of Sampling System 35

The circuit of FIG. 2A is operated to simultaneously sample $V_{PTATP}$ onto a selected group of sampling capacitors C2×10 and also sample $V_{PTATN}$ onto a selected group of sampling capacitors C3×10 (or vice versa), by using the array of associated sampling switches shown in sampling system 35. For example, after a particular unit transistor Q0 is chosen by CTL-VBE and a particular unit current source $I_3$ is chosen by CTL-ISOURCE, a particular combination of unit capacitors C2×10 and C3×10 is chosen by suitable values of the digital signals CTL-PTATNA, CTL-PTATPA, CTL-PTATPB, and CTL-PTATNB so as to appropriately sample the resulting present $V_{BE}$ and $\Delta V_{BE}$ voltages. The structure of sampling circuit 35 allows the left terminal of each one of the capacitors C0, C1, C2×10, and C3×10 to be connected to any one of the voltages, $V_{PTATP}$, $V_{PTATN}$, and ground. CTL-PTATPA connects, by "1"s applied to the gates of N-channel transistors MN57×10, a selected number of capacitors C2×10 to $V_{PTATP}$, and CTL-PTATNA connects, by "1"s applied to the gates of N-channel transistors MN47×10, a selected number of capacitors C2×10 to $V_{PTATN}$.

Similarly, CTL-PTATPB connects, by "1"s applied to the gates of transistors MN50×10, a selected number of capacitors C3×10 to $V_{PTATP}$, and CTL-PTATNB connects, by "1"s applied to the gates of transistors MN53×10, a selected number of capacitors C3×10 to $V_{PTATN}$. Note that if "0"s are present on corresponding bits of CTL-PTATNA and CTL-PTATPA, the left terminal of a corresponding sampling capacitor C2×10 is connected to $V_{SS}$, by the inverting operation of a corresponding NOR gate 33×10. However, corresponding bits of CTL-PTATNA and CTL-PTATPA are never simultaneously equal to "1" because that would short-circuit $V_{PTATP}$ to $V_{PTATN}$. Similarly, if "0"s are present on corresponding bits of CTL-PTATNB and CTL-PTATPB, the left terminal of a corresponding sampling capacitor C3×10 is connected to $V_{SS}$ by the inverting operation of a corresponding NOR gate 34×10. Corresponding bits of CTL-PTATNB and CTL-PTATPB are never simultaneously set equal to "1", in order to avoid short-circuiting of $V_{PTATP}$ to $V_{PTATN}$.

Note that the voltage on nodes 16 and 17 includes the common mode voltage of the integrator 30 with respect to $V_{SS}$, and the differential voltage between conductors 16 and 17 is zero (if integrator 30 is an ideal integrator). The differential band gap charge $Q_{CA}-Q_{CB}$ is effectively transferred through conductors 16 and 17 to the inputs of integrator 30 (FIG. 2B). This charge tends to change the voltages of conductors 16 and 17, but integrator 30 responds by moving the charges through conductors 16 and 17 into the integrating capacitors (such as integrating capacitors 440a and 440b in Prior Art FIG. 1C) that are present (but not shown) in the feedback loop of integrator 30 in FIG. 2B. The capacitors C2×10 and C3×10, and also trimming capacitors C0 and C1 in FIG. 2A, function as input capacitors of integrator 30 to accomplish integrating or averaging of the sequence of intermediate differential reference charge values $Q_{CA}-Q_{CB}$.

Each cycle of band gap voltage reference circuit 10A (FIG. 2B) involves 2 phases (as explained in the Prior Art U.S. Pat. No. 7,504,977 from which Prior Art FIG. 1C is taken). The first phase can be referred to as an "auto-zeroing phase" (to perform auto-zeroing all of the offset voltage of integrator 30) and the second phase can be referred to as an "integrating phase". Each of capacitors C2×10 and C3×10 can be used to sample the $\Delta V_{BE}$ voltage between $V_{PTATP}$ and $V_{PTATN}$ or a $V_{BE}$ voltage between $V_{PTATP}$ and $V_{SS}$.

For example, during each cycle, some of capacitors C2×10 or C3×10 are used to sample a $V_{BE}$ voltage, and the rest of the capacitors in that group are used to sample a $\Delta V_{BE}$ voltage. In this example, 2 pairs of capacitors, each pair including one C2 sampling capacitor and one C3 sampling capacitor, are used for sampling the $V_{BE}$ voltage and 8 pairs are used for sampling the $\Delta V_{BE}$ voltage. During the first phase, (1) the left terminal of all 10 capacitors C2×10 is connected to $V_{PTATP}$; (2) the left terminal of 8 capacitors C3 is connected to $V_{PTATN}$; and (3) the left terminal of 2 capacitors C3 is connected to ground, essentially simultaneously.

Then, during the second phase, the states of the various transistor switches are changed so that the left terminals of the 8 sampling capacitors C2 change from the $V_{PTATP}$ voltage of the previous phase to $V_{PTATN}$, which means that the charge transfer to conductor 16 represents the $\Delta V_{BE}$ voltage multiplied by 8×C2, i.e., by 8 unit capacitances. The left terminals of the other 2 capacitors C2 go from $V_{PTATP}$ to $V_{SS}$., which means that the charge $Q_{CA}$ transferred on conductor 16 for the other two capacitors C2 represents the transfer of charge corresponding to a $V_{BE}$ voltage multiplied by 2×C2, i.e., by 2 unit capacitances.

During the same second phase, the left terminals of all 10 capacitors C3×10 change to $V_{PTATP}$. Consequently, the 2 capacitors C3 that in the previous phase were connected to ground now change to $V_{PTATP}$, and this results in transferring charge that is multiplied by 2 times C3 to conductor 17 from these 2 capacitors. That represents the $V_{BE}$ voltage $V_{PTATP}$. The other 8 unit capacitors C3 that were connected to $V_{PTATN}$ now going to $V_{PTATP}$ represent transfer of charge that corresponds to the $\Delta V_{BE}$ voltage multiplied by 8×C3. Conductor 16 goes toward more negative voltages, and charge that represents $\Delta V_{BE}$ and $V_{BE}$ is transferred to conductor 16 in one direction. Similarly, charge that represents $\Delta V_{BE}$ and $V_{BE}$ is transferred to conductor 17 in the opposite direction. Thus, a differential charge that represents an intermediate value of $V_{REF}$ is transferred to conductors 16 and 17. This differential charge is integrated or transferred into the feedback capacitors (e.g., such as the integrating feedback capacitors 440a and 440b of integrator 30 in Prior Art FIG. 1C) of integrator 30 in FIG. 2B.

Figure 1B:
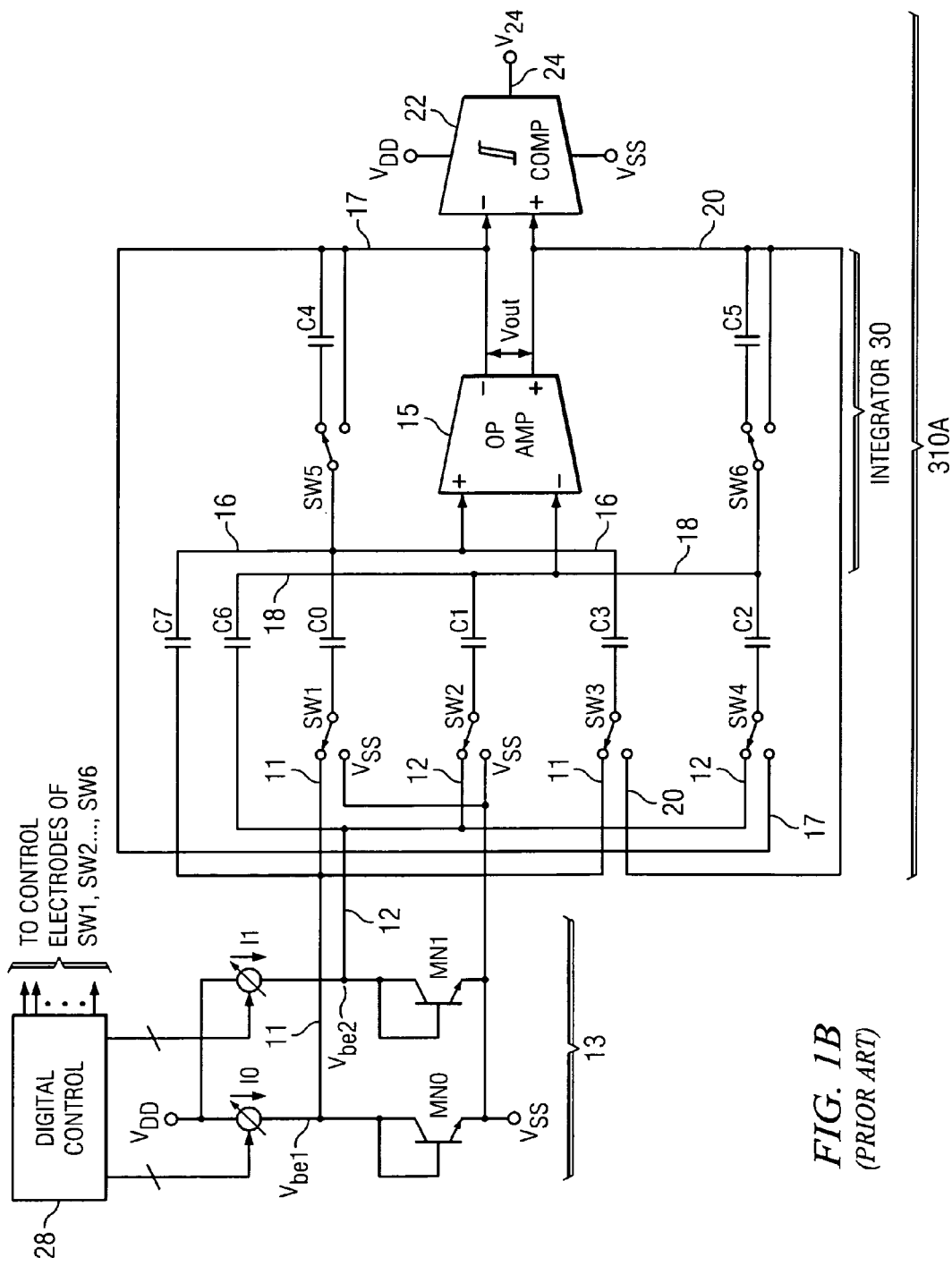
FIG. 1B is a copy of FIG. 6 of commonly assigned U.S. Pat. No. 7,511,648, and shows a known integrator and comparator circuit.
Figure 1C:
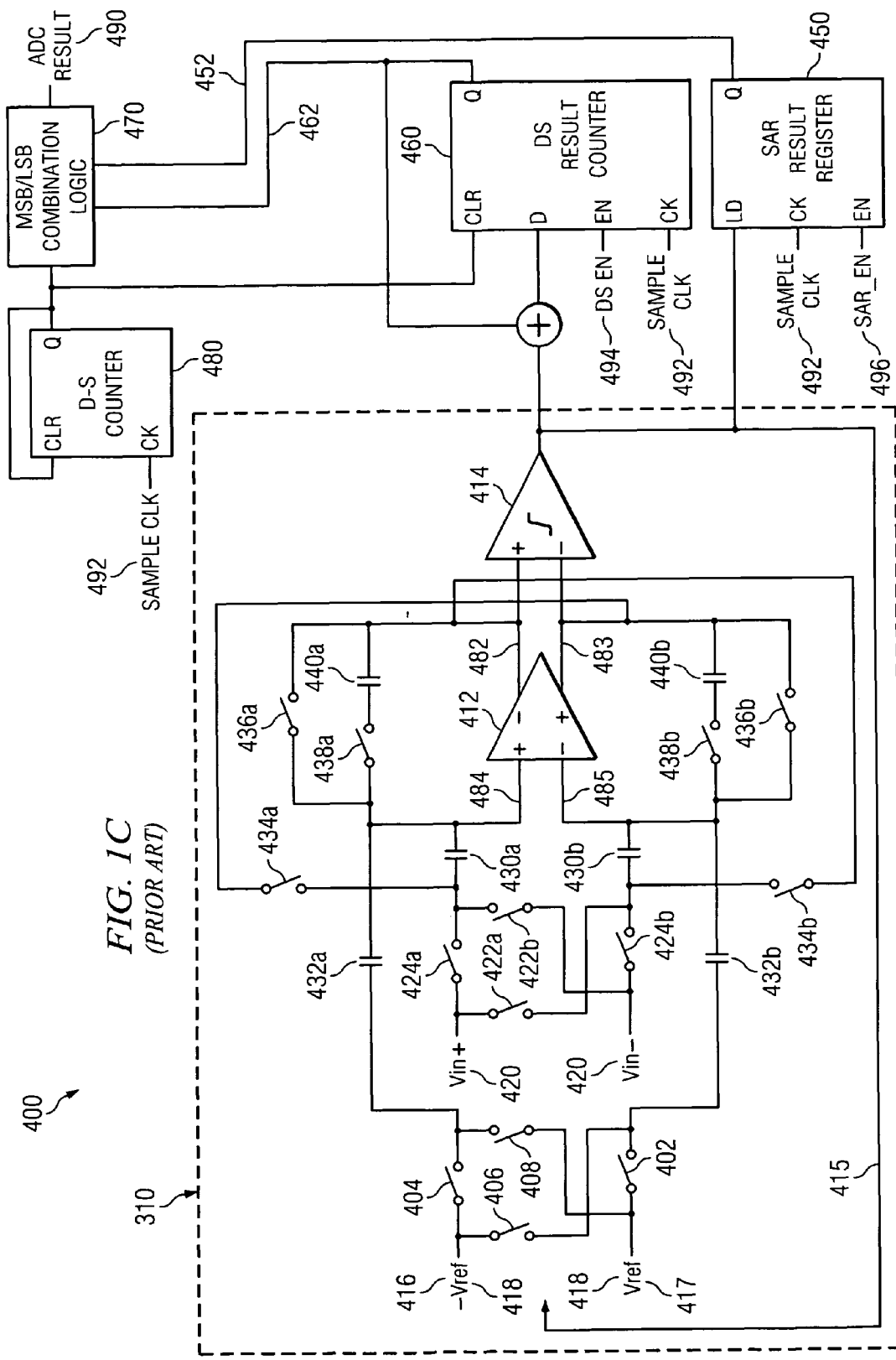
FIG. 1C is a copy of FIG. 3a of commonly assigned U.S. Pat. No. 7,504,977 and shows known switching circuitry for sampling a band gap voltage reference circuit.

Note that above mentioned Prior Art FIG. 1B (which is identical to FIG. 6 of U.S. Pat. No. 7,511,648) shows a similar band gap reference circuit with bipolar "bandgap" transistors MN0 and MN1, switches SW1 and SW2, and capacitors C0 and C1. Transistors MN0 and the MN1 in Prior Art FIG. 1B are analogous to one Q0 transistor and 15 Q0 transistors, respectively, in FIG. 2A Capacitors C0 and C1 in Prior Art FIG. 1B correspond to sampling capacitors C2×10 and C3×10 in FIG. 2A. Also, in previously mentioned Prior Art FIG. 1C (which is identical to FIG. 3a of above mentioned U.S. Pat. No. 7,504,977, capacitors 432a and 432b corresponds to capacitors C2 and C3, respectively, in FIG. 2A, and conductors 484 and 485 correspond to conductor 16 and 17, respectively, in FIG. 2A.

Thus, $V_{PTATP}$ is sampled as a first $V_{BE}$ voltage and $V_{PTATN}$ is sampled as a second $V_{BE}$ voltage, and the difference between $V_{PTATP}$ and $V_{PTATN}$ is equal to the $\Delta V_{BE}$ voltage. Both $V_{PTATP}$ and $V_{PTATN}$ are "$V_{BE}$ voltages" because that is what is obtained by forcing the above mentioned combinations of unit currents I3×7 through the various combinations of diode-connected bipolar transistors Q0×16 and directly sensing the resulting emitter-to-collector voltages thereof. Since the difference between $V_{PTATP}$ and $V_{PTATN}$ is equal to $\Delta V_{BE}$, $V_{PTATP}$ is equal to $V_{PTATN}$ plus the foregoing $\Delta V_{BE}$ voltage, so it is convenient to just sample $V_{PTATP}$ because it includes a $\Delta V_{BE}$ component.

If there is no sampling of an external input voltage as in FIG. 2B, then integrator 30 operates essentially as a low pass filter wherein the differential charge $Q_{CA}$-$Q_{CB}$ is integrated every cycle, and during every cycle integrator 30 loses some charge from its integrating capacitors. Over an interval of time, the integrating results in an average value of the reference voltage $V_{REF}$. However, in the case in which integrator 30 integrates an external input voltage $V_{IN}^+$-$V_{IN}^-$ as in FIG. 2B, whenever a comparator (such as comparator 22 in Prior Art FIG. 1B) switches, then integrator 30 integrates the reference voltage in the opposite direction during the next cycle along with integrating the sampled external input voltage.

Referring again to FIG. 2B, one application of band gap reference voltage circuit 10A is to use it in conjunction with an external input voltage sampling system 22, as indicated by the dashed lines in FIG. 2B. Then sampling system 35 in FIG. 2A operates to sample the differential reference charge $Q_{CA}$-$Q_{CB}$ representing the band gap reference voltage $V_{BE+}\Delta V_{BE}$ produced by band gap reference generator 12, and a similar sampling system (not shown) samples a differential reference charge representing an external differential input voltage Vin+-Vin−, generally as indicated in Prior Art FIG. 1C and described in the above mentioned incorporated-by-reference patent U.S. Pat. No. 7,504,977. The external voltage to be measured is sampled every cycle, and when a comparator switches state in one direction or the other, the band gap reference charge $Q_{CA}$-$Q_{CB}$ produced by the band gap reference generator 12 in FIG. 2A is integrated along with the charge representing the external input voltage. In Prior Art FIG. 1C, the reference voltage and switches 404, 406, 408, 402 and capacitors 432a and 432b are included in a sampling system for the external reference voltage wherein Vin+ and Vin− constitute the external differential input voltage that works together with switches 424a, 422a, 422b, 424b and capacitors 430a and 430b.

The above mentioned unit trimming capacitors C0 and C1 are used to trim the generated reference voltage $V_{REF}$. The pair of unit trimming capacitors C0 and C1 can function either as a capacitor pair with trimmed value or as a pair of unit capacitors that is used only in some cycles and not in others (i.e., in a time division mode). Trimming capacitors C1 and C0 each consist of 1 unit capacitance and can be connected in parallel with the sampling capacitors C2×10 and C3×10, respectively. If C1 and C0 both are trimmable capacitances, they each can be equal to half of a unit capacitance, and the corresponding sampled amount of $\Delta V_{BE}$ and $V_{BE}$ voltage can be adjusted so as to achieve a constant value of the reference output voltage $V_{REF}$ over a temperature range. Alternatively, if C1 and C0 are non-trimmable capacitors, they can be used so that they are in effect trimmable by using them only part of the time.

Figure 3:
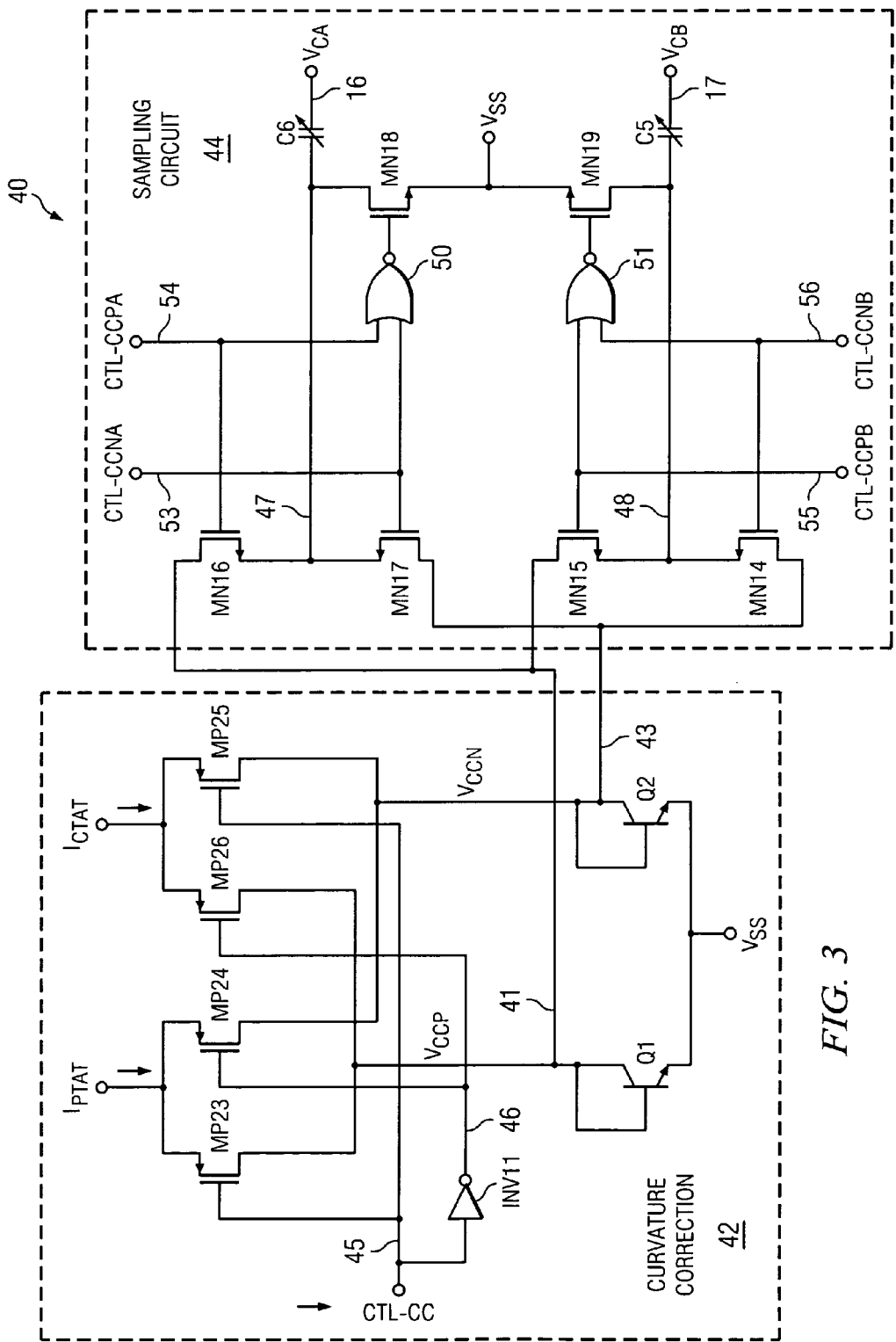
FIG. 3 is a schematic diagram of a circuit for providing curvature correction of the bandgap voltage generated by the circuit of FIG. 2A.

FIG. 3 shows a circuit 40 that provides curvature correction for the voltage reference circuit 10 of FIG. 2A. Circuit 40 includes a curvature correction circuit 42, the output of which is applied to the inputs of a sampling circuit 44. Curvature correction circuit 42 includes P-channel transistors MP23 and MP24 having their sources connected to receive a PTAT current $I_{PTAT}$ and also includes P-channel transistors MP25 and MP26 having their sources connected to receive a CTAT current $I_{CTAT}$. The gates of transistors MP23 and MP25 are connected to a conductor 45 conducting a digital signal CTL-CC. The gates of transistors MP24 and MP26 are connected by conductor 46 to the output of an inverter INV11, the input of which is connected to conductor 45. The drains of transistors MP23 and MP26 are connected by conductor 41 to the collector and base of a diode-connected NPN transistor Q1 having its emitter connected to $V_{SS}$, and the drains of transistors MP24 and MP25 are connected by conductor 43 to the collector and base of a diode-connected NPN transistor Q2 having its emitter connected to $V_{SS}$. A voltage $V_{CCP}$ is produced on conductor 41, and a voltage $V_{CCN}$ is produced on conductor 43.

Sampling circuit 44 of FIG. 3 includes a N-channel transistor MN16 having its drain connected to conductor 41, and also includes a N-channel transistor MN17 having its drain connected to conductor 43 and having its source connected by conductor 47 to the source of transistor MN16, the drain of a N-channel transistor MN18, and one terminal of an adjustable capacitor C6 having its other terminal connected to $Q_{CA}$ conductor 16 of FIG. 2A. The gate of transistor MN16 is connected by conductor 54 to a digital signal CTL-CCPA and to one input of a NOR gate 50, the output of which is connected to the gate of transistor MN18, the source of which is connected to $V_{SS}$. The other input of NOR gate 50 is connected by conductor 53 to the gate of transistor MN17 and to a digital signal CTL-CCNA. Similarly, sampling circuit 44 includes a N-channel transistor MN15 having its drain connected to conductor 41, and also includes a N-channel transistor MN14 having its drain connected to conductor 43 and having its source connected by conductor 48 to the source of transistor MN15, the drain of a N-channel transistor MN19, and one terminal of an adjustable capacitor C5 having its other terminal connected to $Q_{CB}$ conductor 17 of FIG. 2A. The gate of transistor MN15 is connected by conductor 55 to a digital signal CTL-CCPB and to one input of a NOR gate 51, the output of which is connected to the gate of transistor MN19, the source of which is connected to $V_{SS}$. The other input of NOR gate 51 is connected by conductor 56 to the gate of transistor MN14 and to a digital signal CTL-CCNB.

In block 42 in FIG. 3, two current sources (not shown) supply the two currents $I_{PTAT}$ and $I_{CTAT}$ applied to two diode connected transistors Q1 and Q2. The resultant curvature correction voltage is sampled by a pair of capacitors C5 and C6. To achieve optimal reference curvature, C5 and C6 could be trimmable capacitors or they could be a standard pair of capacitors that is used in only a fraction of the sampling cycles. The control signal CTL-CC switches the two currents $I_{PTAT}$ and $I_{CTAT}$ between the two bipolar transistors Q1 and Q2 and in this way substantially eliminates the effect of any mismatch between the bipolar transistors.

In operation, trimmable capacitors C5 and C6, the various switches, and the digital signals CTL-CCNA, CTL-CCPA, CTL-CCPB, and CTL-CCNB in FIG. 3 provide sampling of the voltage $V_{CCP}$ and the voltage $V_{CCN}$. The various switches are operated to cause the sampling of $V_{CCP}$ and $V_{CCN}$ to provide the polarity needed so they can increase or decrease the values of $Q_{CA}$ and $Q_{CB}$ being generated by band gap voltage reference circuit 10 of FIG. 2A as necessary to achieve the desired curvature correction of the differential reference charge $Q_{CA}$-$Q_{CB}$ being generated by band gap voltage reference circuit 10.

The output of curvature correction circuit 40 in FIG. 3 is superimposed on output conductors 16 and 17 in FIG. 2A so as to correct of the curvature of band gap reference generator circuit 12. In FIG. 3, using PTAT current $I_{PTAT}$ and CTAT current $I_{CTAT}$ together results in an opposing variation with respect to temperature, and that results in generation of a correction voltage that itself has a significant curvature in the opposite direction to that produced at the output of sampling system 35 in FIG. 2A. By superimposing this curvature correction voltage onto the output voltage generated between conductors 16 and 17 in FIG. 2A, the curvature behavior of the final band gap reference voltage $V_{REF}$ is effectively corrected. The currents $I_{PTAT}$ and $I_{CTAT}$ are swapped by transistors MP23, MP24, MP25 and MP26 to provide successive or alternate capacitive sampling cycles to average the effects of mismatches between transistors Q1 and Q2 in FIG. 3.

The embodiment of the invention shown in FIGS. 2A and 2B differs from the prior art by providing the capability of choosing which one of the transistors Q0×16 is single unit emitter area element in a band gap voltage reference circuit, and which of the other 15 Q0×16 transistors form a 15 unit emitter area element. For example, in one cycle a first transistor of the transistors Q0×16 may be selected as the unit transistor, and in the next cycle the second transistor Q02 might be chosen, and so forth. By such "rotating", the value of the generated reference voltage $V_{REF}$ can be based on the average of the $V_{BE}$ voltage and the $\Delta V_{BE}$ voltage generated by the entire array of 16 transistors Q0×16. Consequently, the amount of error, noise, etc. does not depend on one single transistor (such as transistor Q5 in Prior Art FIG. 1A). The voltage $V_{PTATP}$ during any cycle depends on which of transistors transistor Q0×16 is chosen cycle and all of the other Q0 transistors are chosen one at a time in the following cycles.

To summarize, the described embodiment of the invention applies a dynamic element matching rotation technique to eliminate the sensitivity of the PTAT $\Delta V_{BE}$ voltage and the CTAT $V_{BE}$ voltage from random variation of bipolar transistors that generate the reference voltage $V_{REF}$. The dynamic element matching rotation substantially eliminates the effect of the offset and drift of the amplifier in Prior Art FIG. 1A and the effect of mismatches of the current sources that generate the $V_{BE}$ and the $\Delta V_{BE}$ voltages by averaging the parameters of these and other components of the circuitry used to generate and sample the $\Delta V_{BE}$ and $V_{BE}$ voltages. This is in contrast to the techniques of using more circuitry and more power than the techniques that are usually utilized in the prior art.

The dynamic element matching rotation technique is applied to "rotate" various capacitors in sampling circuit 35 so that they all function to selectively sample $V_{BE}$ voltages and $\Delta V_{BE}$ voltages during consecutive cycles. This way the combination of $V_{BE}$ and $\Delta V_{BE}$ voltages is accomplished without an amplifier and its associated offset and drift. The effect of mismatch of the sampling capacitors is also eliminated by averaging. If the reference sampling capacitors make a full rotation in L cycles (in this example 5 cycles) and if M, N and L are relatively prime numbers, then the average reference value is derived after M×N×L cycles (in this example 16×7×5=560 cycles). After all of the M×N×L sampling cycles of band gap voltage reference circuit 10 of FIG. 2A has been performed (where M is equal to the number of current sources $I_3$, N is equal to the number of transistors Q0, and L is the number of pairs of capacitors used in sampling of the $V_{BE}$ and $\Delta V_{BE}$ voltages), the resulting average of the band gap differential charges $Q_{CA}$-$Q_{CB}$ has much less sensitivity to random mismatch, defects, and stress of the individual $V_{BE}$ and $\Delta V_{BE}$ voltages than the band gap voltage reference circuits used in the prior art.

The above described band gap voltage reference circuit provides advantages of excellent long term stability and tight distribution of its temperature drift, achieved using very little integrated circuit chip area. Furthermore, the described band gap reference voltage circuit has the capability of providing a high reference voltage value, and accordingly lower noise and power dissipation in the system. Also, the value of the generated band gap reference voltage $V_{REF}$ of the described embodiment of the invention is dependent only on the average value of current $I_3$×7 flowing through the bipolar transistors Q0×16 that take part in determining the reference voltage $V_{REF}$, and, as a second order effect, is dependent on the average value rather than the actual values of the current sources that form the $V_{BE}$ and $\Delta V_{BE}$ voltages. The present invention also avoids sensitivity of the generated reference voltage $V_{REF}$ from the offset and drift of an amplifier. Furthermore, the sensitivity of the described bandgap voltage reference circuit depends on the total amount of chip area used rather than the area of a single unit bipolar transistor. For example, if the bipolar transistors are scaled in the ratio 1 to 15, the output value $V_{REF}$ will depend on the random variation of an array of 16 transistors Q0×16 instead of on the random variation of a single transistor as in Prior Art FIG. 1A.

Furthermore, the described circuit topology allows more aggressive scaling of the transistor area and current ratios. Aggressive scaling of the current ratios in the band gap generation circuit 12 can result in a large $\Delta V_{BE}$ voltage, and this allows use of small number of sampling capacitors. This in turn allows a higher scaled-up value of $V_{REF}$ to be achieved. Also, the band gap voltage reference system 10 of FIG. 2A circuit operates with a low value of supply voltage $V_{DD}$, and can provide a high effective value of reference voltage $V_{REF}$ that is higher than the supply voltage $V_{DD}$.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, the charge that represents the $\Delta V_{BE}$ and $V_{BE}$ voltages is transferred through the sampling capacitors C2×10 and C3×10 in the embodiment of the invention shown in FIG. 2A. 10 pairs of sampling capacitors C2 and C3 are used in this example, where in each of the L=5 combinations of sampling capacitors, 2 pairs of sampling capacitors (two from each of C2 and C3) are used to sample $V_{BE}$, and the other 8 pairs are used to sample $\Delta V_{BE}$. However, the sampling operation would be the same if instead each group of sampling capacitors C2 and C3 were to be composed of 5, rather than 10, unit capacitors. In that case, 1 pair would be used to sample $V_{BE}$ and the other 4 pairs would be used to sample $\Delta V_{BE}$, and L would still be equal to 5.

Furthermore, various patterns of rotation of unit current sources $I_3$ and unit transistors Q0 can be used. For example, if 3 combinations of unit current sources $I_3$ and 4 combinations of unit transistors Q0 are provided, then one way to rotate them would be to provide the first possible combination of unit currents $I_3$ and then rotate the 4 combinations for unit transistors Q0. Then, the second combination of unit currents could be provided and the 4 combinations for unit transistors could be rotated again. Then this procedure could be repeated for the last combination of unit currents and all 12 possible combinations would be achieved in 3×4=12 cycles. However, another way to rotate the 3 combinations of unit current sources $I_3$ and 4 combinations of unit transistors Q0 would be to use the first combination of unit currents and the first combination of unit transistors, during a first cycle, the second combination of unit currents and the second combination of unit transistors during a second cycle, the third combination of unit currents and the third combination of unit transistors during a third cycle, the first combination of unit currents and the fourth combination of unit transistors during a fourth cycle, and the second combination of unit currents and the first combination of unit transistors during a fifth cycle. If the number of combinations of unit currents and the number of combinations of unit transistors both are prime numbers, then, in the same total number of combinations of unit currents and unit transistors as in the previous example, rotation of all of the unit transistors and all of the unit currents will have been achieved, and good matching will have been achieved. But if the numbers of combinations of the unit currents and unit transistors are not prime numbers, rotation of at all of the unit transistors and all of the unit currents in this example will not have been achieved. For this rotation technique, if the numbers of combinations are not prime numbers, good averaging results will not be achieved.

Although diode-connected NPN transistors are used as diodes in the described embodiments because they have more ideal circuit characteristics than simple PN diodes, in some applications PN diodes could be utilized.

In FIG. 2A, all of the currents that flow into transistors Q0×16 are PTAT currents. The best curvature behavior is achieved for bipolar transistors with PTAT currents. However, other kinds of current could be used, such as CTAT current or zero-temperature-coefficient current.

What is claimed is:

1. A band gap voltage reference circuit comprising:
   a band gap reference generator circuit including:
   current source circuitry for supplying a first current to a first conductor and a second current to a second conductor, wherein the current source circuitry includes a plurality of unit current sources each for delivering a unit current;
   a plurality of diodes each having a cathode terminal coupled to a first reference voltage,
   a first group of switches for selectively coupling the first conductor to anode terminals of the diodes, respectively, in response to a first digital control signal to cause the first current to flow into a selected diode,
   a second group of switches for selectively coupling the second conductor to anode terminals of the diodes which are not selectively coupled to the first conductor in response to the first digital control signal to cause the second current to flow into and be shared among the diodes which are not selectively coupled to the first conductor, wherein the first control signal has values which cause the diodes to be successively coupled to the first conductor so that the first current causes the diodes, respectively, to produce corresponding relatively large VBE voltages on the first conductor and the second current causes the successively coupled diodes not coupled to the first conductor to produce corresponding relatively small VBE voltages on the second conductor, a difference between each relatively large VBE voltage and a corresponding relatively small VBE voltage being equal to a corresponding $\Delta$VBE voltage;
   a third group of switches for selectively coupling the first conductor to the unit current sources, respectively, in response to a second digital control signal to produce the first current; and
   a fourth group of switches for selectively coupling the second conductor to the unit current sources which are not selectively coupled to the first conductor in response to the second digital control signal to produce the second current;
   sampling circuitry for sampling the relatively large VBE voltages and the relatively low VBE voltages to generate differential band gap charges; and
   averaging circuitry coupled by first and second output conductors of the sampling circuitry to receive the differential band gap charges for averaging successive differential band gap charges to provide a stable band gap reference voltage.

2. The band gap voltage reference circuit of claim 1 including a switch controller for generating the first control signal.

3. The band gap voltage reference circuit of claim 1 wherein each diode is an NPN diode-connected transistor, and wherein each anode terminal includes a collector of a diode-connected transistor, and wherein each cathode terminal includes an emitter of a diode-connected transistor, and wherein, and wherein each of the diode-connected transistors is a unit transistor.

4. The band gap voltage reference circuit of claim 3 wherein a third conductor is coupled to the switches of the first group, the switches of the second group, switches of a fifth group, and switches of a sixth group, the switches of the fifth group coupling a fourth conductor to the third conductor in response to the first digital control signal to avoid voltage drop errors across the switches of the first group, the switches of the sixth group coupling a fifth conductor to the third conductor in response to the first digital control signal to avoid voltage drop errors across the switches of the second group.

5. The band gap voltage reference circuit of claim 4 wherein a switch controller generates the second digital control signal such that the unit current sources are successively coupled to the second conductor to generate the relatively small VBE voltages on the second conductor, such that the unit current sources not coupled to the second conductor generate the relatively large VBE voltages on the first conductor, thereby producing the $\Delta$VBE voltages.

6. The band gap voltage reference circuit of claim 5 wherein the sampling circuitry includes a first group of sampling capacitors and a second group of sampling capacitors, for sampling the relatively large VBE voltages and the relatively small VBE voltages to produce a first output charge and a second output charge, the first and second output charges being applied as inputs to the averaging circuitry, differences between corresponding first and second output charges being equal to the differential band gap charges, respectively.

7. The band gap voltage reference circuit of claim 6 wherein the switch controller generates a plurality of digital control signals as control inputs to various switches coupled to the sampling capacitors of the first and second groups of sampling capacitors to rotate sampling capacitors in each of the first and second groups of sampling capacitors a predetermined number of times for each sampling of the relatively large VBE voltages and the relatively small VBE voltages.

8. The band gap voltage reference circuit of claim 6 wherein the sampling circuitry includes a first trimming capacitor coupled by a first switch to the fourth conductor in response to a first digital trim signal and also coupled by a second switch to the fifth conductor in response to a second digital trim signal, and wherein the sampling circuitry also includes a second trimming capacitor coupled by a third switch to the fourth conductor in response to a third digital trim signal and also coupled by a fourth switch to the fifth conductor in response to a fourth digital trim signal.

9. The band gap voltage reference circuit of claim 6 including curvature correction circuitry coupled to generate curvature correction charges in the first and second output conductors of the sampling circuitry to correct curvature in the differential band gap charges.

10. The band gap voltage reference circuit of claim 4 wherein the band gap reference generator circuit includes a first group of inverters each having an input coupled to the first digital control signal and an output coupled to control terminals of corresponding switches of the second and sixth groups, the first digital control signal being coupled directly to control terminals of corresponding switches of the first and fifth groups, and wherein the band gap reference generator circuit also includes a second group of inverters each having an input coupled to the second digital control signal and an output coupled to a control terminal of a corresponding switch of the fourth group, the second digital control signal being coupled directly to control terminals of switches of the third group.

11. The band gap voltage reference circuit of claim 4 wherein the switches from the first, second, third, fourth, fifth, and sixth groups of switches are transistors.

12. The band gap voltage reference circuit of claim 11 wherein the transistors of the first, second, fifth, and sixth groups are N-channel transistors and the transistors of the third and fourth groups are P-channel transistors.

13. The band gap voltage reference circuit of claim 3 wherein the transistors are unit transistors, and the number of unit transistors is equal to 16.

14. The band gap voltage reference circuit of claim 13 wherein the transistors are unit transistors, and the number of unit transistors is equal to 16 and wherein the number of unit current sources is equal to 7.

15. An apparatus comprising:
a control circuit that is configured to supply first and second control signals;
a band gap reference circuit having:
a first node;
a second node;
a third node;
a fourth node;
a plurality of unit current sources;
a first set of switches, wherein each switch from the first set of switches is coupled between at least one of the unit current sources and the first node, and wherein each switch from the first set of switches is controlled by the first control signal;
a second set of switches, wherein each switch from the second set of switches is coupled between at least one of the unit current sources and the second node, and wherein each switch from the second set of switches is controlled by the first control signal;
a first set of switch circuits that are coupled in parallel with one another between the first node and the fourth node, wherein each switching circuit from the first set of switching circuits is controlled by the second control signal;
a second set of switching circuits that are coupled in parallel with one another between the second node and the fourth node, wherein each switching circuit form the second set of switching circuits is controlled by the second control signal; and
a plurality of bipolar transistors, wherein each bipolar transistor is diode-connected, and wherein each bipolar transistor is coupled to at least one of the switching circuits from the first set of switching circuits, and wherein each bipolar transistor is coupled to at least one of the switching circuits from the second set of switching circuits;
a sampling circuit that is coupled to the third and fourth nodes; and
an averaging circuit that is coupled to the sampling circuit.

16. The apparatus of claim 15, wherein each switching circuit from the first set of switches further comprises:
a fifth node that is coupled to at least one of the bipolar transistors;
a first transistor that is coupled between the first and fifth nodes; and
a second transistor that is coupled between the fifth and fourth nodes.

17. The apparatus of claim 16, wherein each switching circuit from the second set of switches further comprises:
an inverter that is configured to receive at least a portion of the second control signal;
a sixth node that is coupled to at least one of the bipolar transistors;
a third transistor that is coupled between the second and sixth nodes and that is coupled to the inverter; and
a fourth transistor that is coupled between the sixth and third nodes and that is coupled to the inverter.

18. The apparatus of claim 17, wherein the inverter further comprise a first inverter, and wherein each switch from the first set of switches further comprises a fifth transistor, and wherein each switch from the second set of switches further comprises:
a second inverter that is configured to receive at least a portion of the first control signal; and
a sixth transistor that is coupled to the second node and the second inverter.

19. The apparatus of claim 18, wherein the apparatus further comprises a curvature correction circuit that is coupled to the sampling circuit and the averaging circuit.

20. The apparatus of claim 19, wherein the averaging circuit is an integrator.

* * * * *